United States Patent
Chiba et al.

(10) Patent No.: US 8,371,367 B2
(45) Date of Patent: Feb. 12, 2013

(54) HEAT SINK AND FABRICATING METHOD OF THE SAME

(75) Inventors: Hiroshi Chiba, Chiyoda-ku (JP); Tetsuro Ogushi, Chiyoda-ku (JP); Hideo Nakajima, Suita (JP)

(73) Assignees: Mitsubishi Denki Kabushiki Kaisha, Tokyo (JP); Osaka University, Suita-shi (JP)

(*) Notice: Subject to any disclaimer, the term of this patent is extended or adjusted under 35 U.S.C. 154(b) by 1105 days.

(21) Appl. No.: 12/063,495

(22) PCT Filed: Aug. 11, 2005

(86) PCT No.: PCT/JP2005/014731
§ 371 (c)(1),
(2), (4) Date: Feb. 11, 2008

(87) PCT Pub. No.: WO2007/017945
PCT Pub. Date: Feb. 15, 2007

(65) Prior Publication Data
US 2010/0139904 A1  Jun. 10, 2010

(51) Int. Cl.
H05K 7/20 (2006.01)
(52) U.S. Cl. .......... 165/185; 165/907; 361/704
(58) Field of Classification Search ............ 165/907, 165/80.3, 185; 361/704
See application file for complete search history.

(56) References Cited

U.S. PATENT DOCUMENTS

| | | | |
|---|---|---|---|
| 5,726,495 A * | 3/1998 | Aihara et al. | 257/722 |
| 5,814,536 A | 9/1998 | Rostoker et al. | |
| 6,018,459 A | 1/2000 | Carlson et al. | |
| 6,503,626 B1 * | 1/2003 | Norley et al. | 165/907 |
| 6,888,720 B2 * | 5/2005 | Pfister et al. | 361/689 |
| 7,198,094 B2 * | 4/2007 | Barsun et al. | 165/80.3 |
| 2003/0136545 A1 | 7/2003 | Lin et al. | |
| 2004/0000392 A1 * | 1/2004 | Chen et al. | 165/80.3 |

FOREIGN PATENT DOCUMENTS

| | | |
|---|---|---|
| CA | 1 238 428 | 6/1988 |
| CN | 2484146 Y | 4/2002 |
| CN | 1514488 A | 7/2004 |
| JP | 5 6948 | 1/1993 |
| JP | 6-61387 A | 3/1994 |
| JP | 10 88254 | 4/1998 |
| JP | 2001 358270 | 12/2001 |
| JP | 2002 110874 | 4/2002 |

(Continued)

OTHER PUBLICATIONS

Office Action issued Dec. 21, 2010, in Japan Patent Application No. 2007-529442 (with English translation).

(Continued)

*Primary Examiner* — Leonard R Leo
(74) *Attorney, Agent, or Firm* — Oblon, Spivak, McClelland, Maier & Neustadt, L.L.P.

(57) ABSTRACT

A heat sink includes a base having a first surface thermally connected to a heat producing component and a plurality of fins supported by a second surface of the base and arranged in a predetermined direction, each fin having a plurality of through-holes. The base and the plurality of fins are integrally formed from a porous material, for example a lotus-shaped porous material. The heat sink is placed within a duct. The heat sink may have a width of about 10 mm or less.

8 Claims, 21 Drawing Sheets

FOREIGN PATENT DOCUMENTS

| | | |
|---|---|---|
| JP | 2003 309385 | 10/2003 |
| JP | 2004 22914 | 1/2004 |
| JP | 2005 228948 | 8/2005 |
| JP | 4458872 B2 | 4/2010 |
| TW | 200413688 | 8/2004 |

OTHER PUBLICATIONS

Japanese Office Action issued Sep. 21, 2010 in Japanese Application No. 2007-529442.

* cited by examiner (a)

(b)

(a)

(b)

(c)

(a)

(b)

(a)

(b)

(a)

(b)

(a)

(b)

(c)

(a)

(b)

(c)

(a)

(b)

(c)

(a)

(b)

(a)

(b)

(a)

(b)

HEAT SINK AND FABRICATING METHOD OF THE SAME

TECHNICAL FIELD

The present invention relates to a heat sink and a method for fabricating the same and, more particularly, relates to a heat sink using a porous material and a method for fabricating the same.

BACKGROUND ART

Semiconductor devices which generate large amounts of heat during operations, as semiconductor power modules, employ heat sinks for releasing heat generated from heat producing components, such as IBGTs. In general, a heat sink is constituted by a plate-shaped base on which a heat producing component is placed and a plurality of fins mounted to the base. The fins are placed within a refrigerant flow path, so that heat generated from the heat producing component is transferred to the refrigerant through the base and the fins.

As an example of such a heat sink, Patent document 1 discloses a heat sink having fins made of a porous material so that a refrigerant is flowed through a plurality of holes penetrated through the fins.

Patent document 1: JP 2001-358270, A

DISCLOSURE OF THE INVENTION

Problems to be Solved by the Invention

However, conventional heat sinks have been fabricated by applying machining to a porous material for forming fins and thereafter attaching the plurality of fins to a base, which has required large times and costs for fabricating the heat sinks, thereby involving reduction of productivities.

Therefore, it is an object of the present invention to provide a heat sink which realizes high productivity.

According to the present invention, there is provided a heat sink including a base having a first surface which is thermally connected to a heat producing component and a plurality of fins which are supported by a second surface of the base opposite from the first surface and are arranged in a predetermined direction, each fin having a plurality of through-holes, wherein the base and the plurality of fins are integrally formed from a porous material.

According to the present invention, the base and the plurality of fins are integrally formed from a porous material, which eliminates the necessity of bonding the fins to the base one by one, thereby reducing the time and costs for fabricating the heat sink and increasing the productivity.

Figure 1:
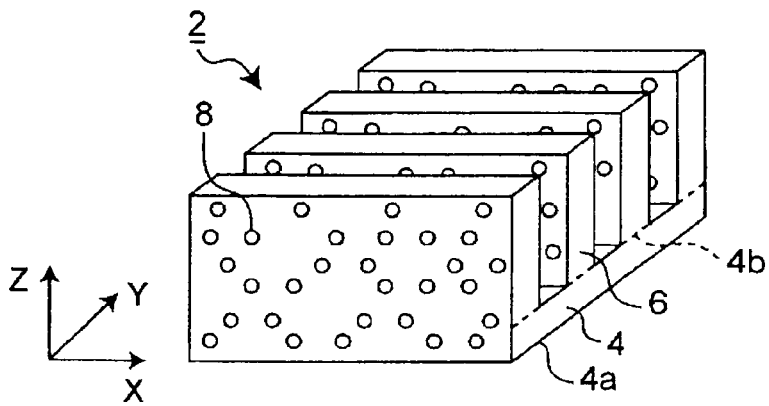
FIG. 1 illustrates a heat sink according to a first embodiment of the present invention.
Figure 1:
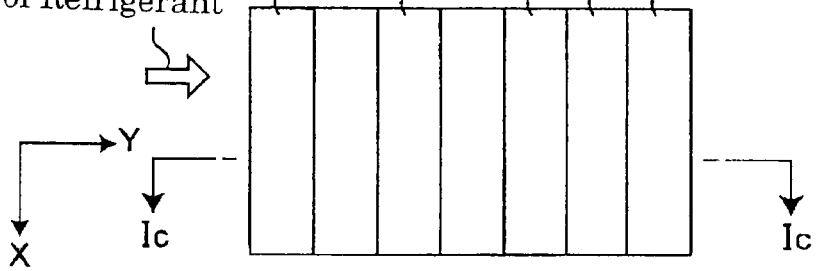
Figure 1:
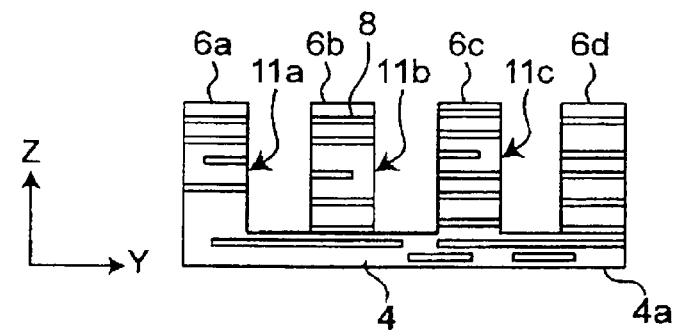
Figure 1:
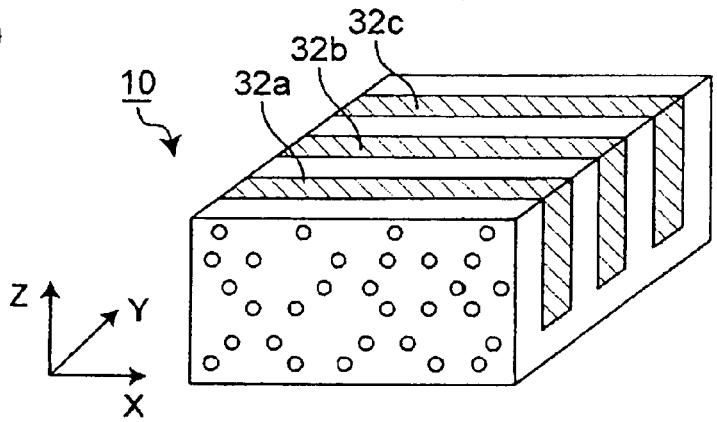

DESCRIPTION OF SYMBOLS 2 heatsink
4 base
6 fin
8 hole
10 porous member (lotus-shaped porous member)
41 through-slot

BEST MODE FOR CARRYING OUT THE INVENTION

Hereinafter, embodiments of the present invention will be described, with reference to the accompanying drawings. In the following description, identical or similar components will be designated by identical reference symbols or identical reference symbols plus additional symbols, throughout the several drawings.

First Embodiment

FIGS. 1(a) to (c) illustrate a heat sink according to the present first embodiment, which is generally illustrated by 2. The heat sink 2 includes a plate-shaped base 4 having a flat surface (first surface) 4a which is adapted such that a heat producing component, not illustrated, is placed thereon (which is thermally connected to the heat producing component), and a plurality of plate-shaped fins 6 (6a, 6b, 6c and 6d) (four fins, in the illustrated example) which are substantially perpendicular to the base 4, the fins 6 being supported by the base 4 through a flat surface (second surface) 4b opposite from the flat surface 4a such that the fins 6 are spaced apart from one another in parallel. In the following description, it will be assumed that the base 4 is positioned in parallel to an XY plane, the fins 6a to 6d are arranged in a Y direction, and each fin 6 is positioned in parallel to the XZ plane.

Each fin 6 is a lotus-shaped (lotus-root-shaped) member having a plurality of tubular-shaped holes 8 extending substantially in the Y direction. In operation of the heat sink 2, a refrigerant is flowed through the fins 6a, 6b, 6c and 6c in the mentioned order, in a +Y direction, through the holes 8. As the refrigerant, for example, a liquid such as cooling water or antifreeze (such as ethylene glycol) or a gas such as a cold air or chlorofluorocarbon is employed. In order to prevent the leakage of the refrigerant, generally, there are provided pipes upstream and downstream of the heat sink 2 in a direction of the flow of the refrigerant and, also, there are provided plates for sealing the upper portions and the side portions of the fins 6 for flowing the refrigerant therethrough. However, in cases of air-cooling types, it is also possible to expose the fins 6 to air, instead of flowing cold air through the pipes.

The base 4 and the fins 6 of the heat sink 2 are integrally formed by applying cutting processing to a rectangular-parallelepiped shaped porous member (lotus-shaped porous member) 10 (FIG. 1(d)) made of metal such as copper, magnesium, aluminum or silicon for forming one or more slots 11 (11a, 11b and 11c) (three slots, in the example of FIG. 1(d)) which are parallel to the XZ plane. Further, as is apparent from the above description, the flat surface 4b of the base 4 partially forms the bottom surfaces of the slots 11 (the external appearance of the heat sink 2) and also partially forms an imaginary boundary between the base 4 and the fins 6.

Further, the heat sink 2 is used for cooling the CPU or MPU in a personal computer or a large-sized computer, for example (this applies to the following embodiments).

Figure 2:
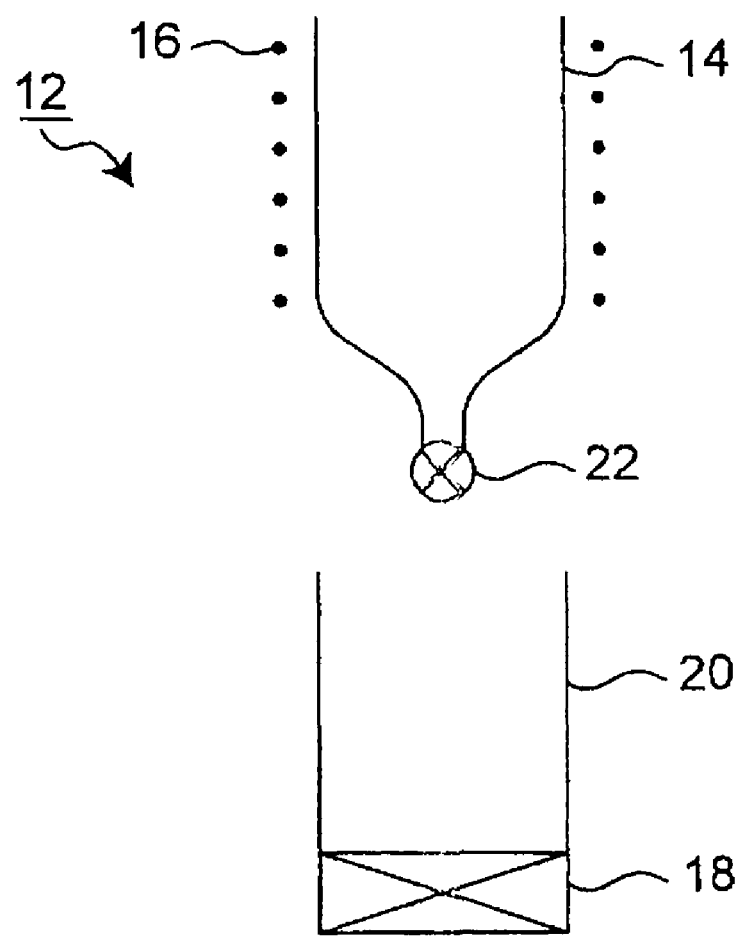
FIG. 2 illustrates an apparatus for molding a porous metal (lotus-shaped porous member)
Figure 3:
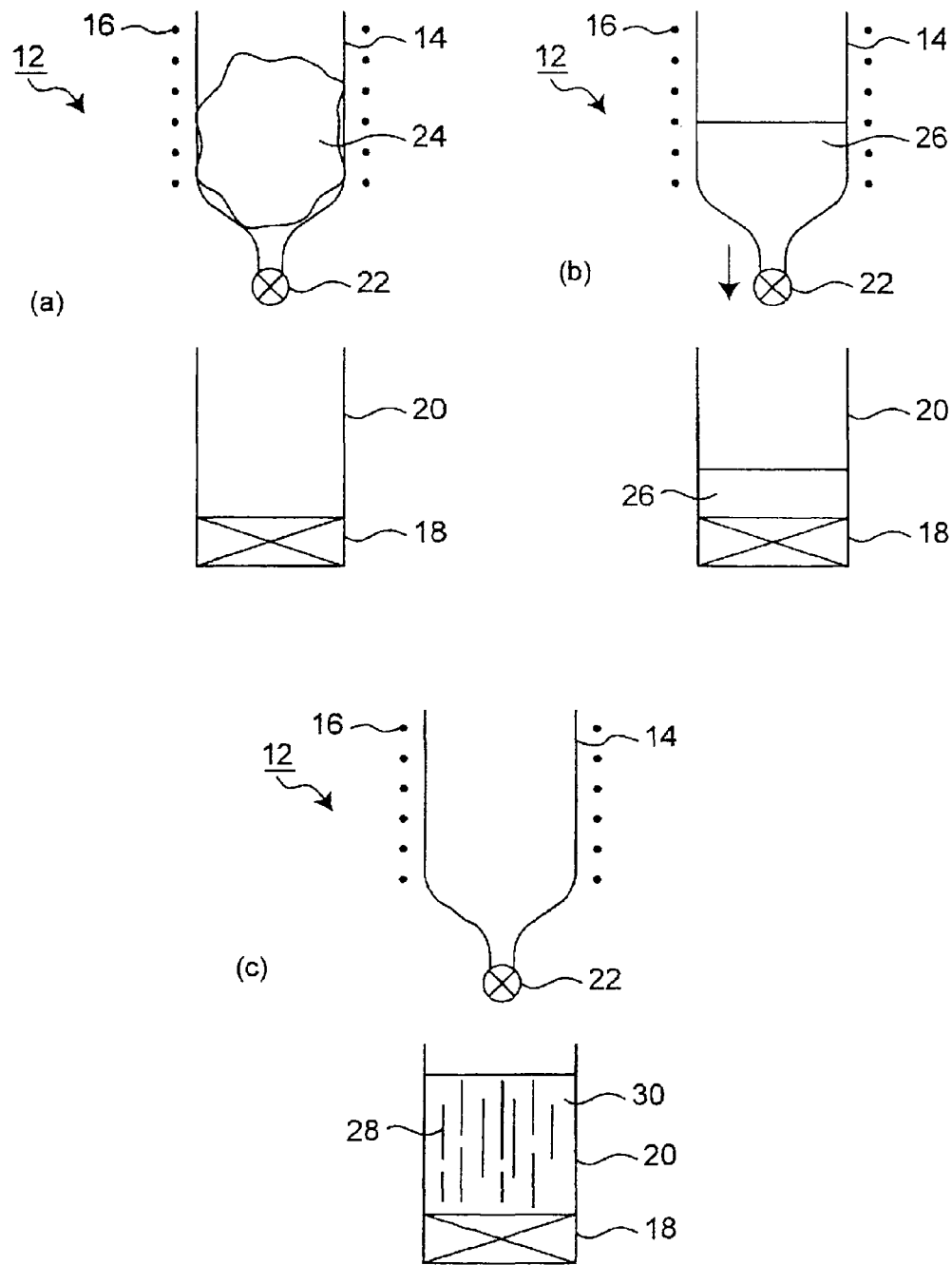
FIG. 3 illustrates processes for fabricating a porous metal (lotus-shaped porous member)

Hereinafter, there will be described a method for forming the heat sink 2, with reference to FIGS. 2 and 3.

First, a metal having a plurality of tubular-shaped throughholes is formed, according to a well-known method which will be described later (which is referred to as a metal solidification method in the present application and is disclosed in detail in, for example, JP 10-88254, A). FIG. 2 illustrates a molding apparatus for use in forming such a porous metal. The molding apparatus 2 includes a crucible 14 for storing a metal bulk. A coil 16 for heating the crucible 14 is wound around the outer peripheral portion of the crucible 14, which enables melting the metal within the crucible 14 by applying a high-frequency electric current to the coil 16. Under the crucible 14, there is placed a mold 20 including a cooling portion 18 at bottom side of the mold 20, which enables pouring the molten metal into the mold 20 through a shut-off valve 22 mounted to a lower end of the crucible 14.

The crucible 14 and the mold 20 are placed within a sealing container (not illustrated), and the inside of the container is filled with a gas maintained at a predetermined pressure. This gas and the metal exhibit a metal-gas phase diagram having an eutectic point in an isobaric gas atmosphere. For example, hydrogen, nitrogen or the like is selected as the gas, in cases where the metal is copper or aluminum. In the metal solidification method, gas atoms dissolve in the metal in a liquid state at temperatures higher than the temperature at the eutectic point, but gas atoms exist as gas without dissolving in the metal at a solid state at temperatures lower than the temperature at the eutectic point.

With the molding apparatus 12, at first, the sealing container is placed in an isobaric gas atmosphere and, also, a bulk of metal 24 is mounted within the crucible 14 (FIG. 3(a)). A high-frequency electric current is applied to the coil 16 with the shutoff valve 22 closed to melt the bulk of metal 24 within the crucible 14. As a result, the molten metal absorbs an amount of gas according to the concentration and the pressure of the gas. Next, the molten metal 26 is flowed into the mold 20 by opening the shutoff valve 22 (FIG. 3(b)). Since the cooling portion 18 is provided at the bottom portion of the mold 20, there is formed a temperature gradient from the bottom portion of the mold 20 to the upper portion thereof. As a result, the solidification of the metal proceeds from the bottom portion of the mold 20 to the upper portion thereof. In the process of the solidification of the molten metal, a eutectic reaction which divides the molten metal containing gas atoms dissolved therein into metal in a solid state and gas in a gaseous state occurs. Holes which form gas paths are grown in an upward direction from the bottom portion of the mold 20, which results in formation of a porous metal (porous material) 30 having tubular-shaped holes 28 formed therein (FIG. 3(c)). Further, it is also possible to employ silicon which is a semiconductor, instead of metal, for forming a porous material with the aforementioned metal solidification method. In this case, processes which will be described later are applied to the porous material made of silicon.

Subsequently, the porous metal 30 obtained from the metal solidification method is shaped into a rectangular-parallelepiped shape, using, for example, an end mill, to complete the formation of a porous member 10 (FIG. 1(d)). Then, slots are formed by applying, for example, electric discharge wire machining to the porous member 10. More specifically, with reference to FIG. 1(d), an electric-discharge wire extending in an X direction (not illustrated) is placed above an imaginary area 32a (which intersects with a direction of the extension of the holes 8 at an angle of about 90 degree) of the porous member 10 which corresponds to a to-be-formed slot 11a. Then, the electric-discharge wire is moved in a −Z direction to a position which is higher than a lower surface (corresponding to the flat surface 4a) by the amount corresponding to a thickness of the base 4 of the heat sink 2. Thereafter, it is raised in a +Z direction to form a slot 11a. A thickness (the length in the Y direction) of the slot 11a is at least the diameter of the wire. The aforementioned operations are repeatedly applied to the remaining two imaginary areas 32b and 32c to form slots 11b and 11c, which results in the formation of a heat sink 2 having lotus-shaped fins 6a to 6d formed therein (due to the characteristics of the metal solidification method, non-through holes, as well as through holes 8, are also formed in the fins 6 (see FIG. 1(c)), and the cross-sectional shapes of the through holes are not limited to round shapes).

In general, the cooling ability of the porous member is increased with the value of the product Sp×hp of the area Sp of the holes which contacts with the refrigerant (the heat transfer area) and the convective heat transfer coefficient hp with which heat transfers from the inner surfaces of the holes to the refrigerant. Regarding to the fins 6 employed in the present embodiment, it is also possible to increase the number of holes 8 for increasing Sp in order to increase the cooling ability and, also, it is possible to reduce the diameters of the holes 8 to increase the flow velocity of the refrigerant passing through the holes for increasing hp.

Also, it is possible to fabricate a lotus-shaped porous metal having holes with diameters in the range of several tens of micrometers to several millimeters and having an arbitrarily-set vacancy ratio, according to the method disclosed in JP 10-88254, A. Further, according to this fabrication method, it is possible to provide a lotus-shaped porous metal easily with a lower cost.

Further, structures which employ foamed materials (for example, foam metals such as foamed aluminums) having non-tubular through-holes as porous members are also included in the scope of the present invention. However, it is more preferable to use a lotus-shaped porous member 10, namely lotus-shaped fins 6, since the use thereof can prevent the refrigerant flowing through adjacent holes from merging with one another and also prevents the refrigerant flowing through holes from diverting, which can prevent the occurrence of pressure losses due to merging and diverting, thereby offering a heat sink which exhibits a lower pressure loss.

Particularly, since the lotus-shaped porous member 10 has holes having a length of about 10 mm in the Y direction in FIG. 1(c), it is possible to increase the number of holes 8 penetrating through the fins 7 for increasing the cooling ability of the fins 6, by setting a thickness of the fins 6 in the Y direction to 10 mm or less.

As described above, in the present embodiment, cutting processing is applied to the porous member 10 to form the slots 11 for forming the base 4 and the fins 6, which eliminates the necessity of processing for bonding a plurality of fins to a base one by one, thereby increasing the productivity, unlike the aforementioned conventional structure.

Further, in cases of coupling the fins to the base through an adhesive agent as in a conventional art, the coupling portions have lower heat transfer coefficients, which has made it difficult to improve the heat releasing characteristics. On the contrary, the heat sink 2 according to the present embodiment has the fins 6 and the base 4 which have been integrally formed, which can improve the heat releasing characteristics.

Further, heat sinks having a single slot formed therein and therefore having two fins are also included in the scope of the present invention. Further, the present invention is not limited by the shape of each fin, the shape of the base (including the shapes of the first and second surfaces 4a and 4b) and the cutting method for forming the slots.

Figure 4:
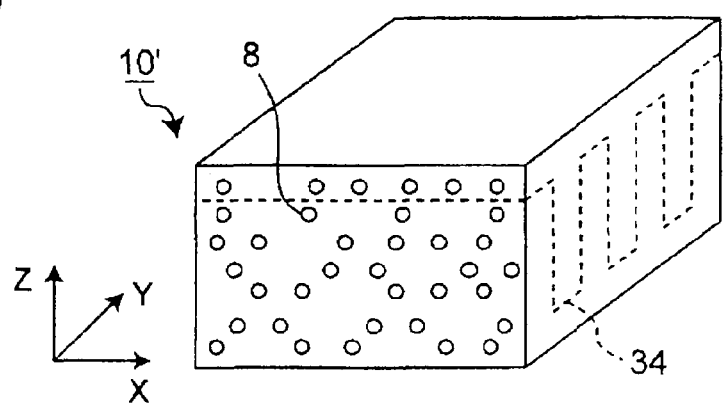
FIG. 4 illustrates another heat sink according to the first embodiment of the present invention.
Figure 4:
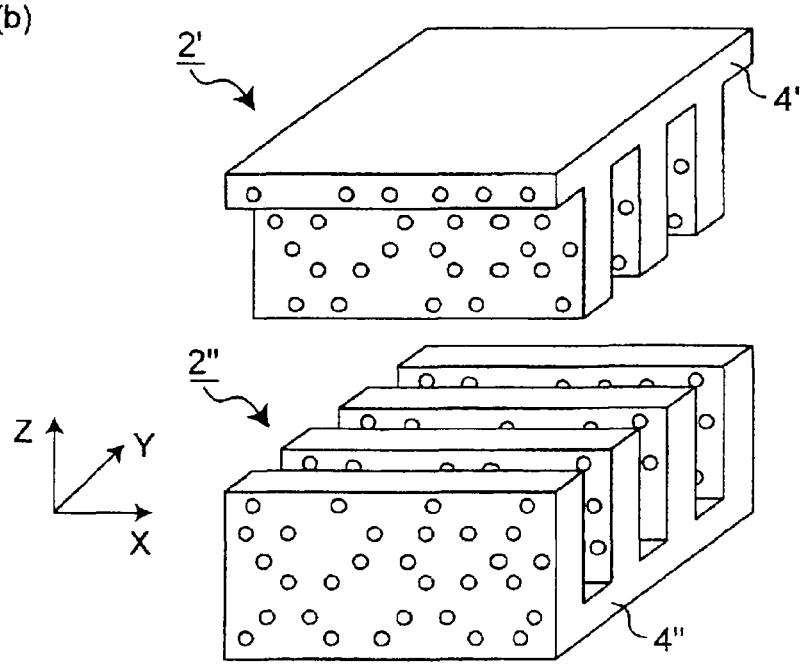

FIGS. 4(a) and (b) illustrate another method for providing a heat sink according to the present invention by cutting a porous member. In this method, a rectangular-parallelepiped-shaped porous member 10' formed in the same way as the aforementioned method is prepared. Then, an electric-discharge wire is moved relative to the porous member 10' along an imaginary surface 34 of the porous member 10' to fabricate heat sinks 2' and 2" which are substantially identical to each other. The wire used therein has a diameter sufficiently smaller than the width (the length in the Y direction) of the to-be-formed slots, unlike in the aforementioned cutting method. More specifically, the electric-discharge wire is brought into contact with a side surface in the Y direction, at a position which is lower than the upper side by the amount corresponding to the thickness of the base 4' of the heat sink 2'. Then, 1) the electric-discharge wire is moved in the +Y direction by a predetermined distance (for example, 1 mm or more and, preferably, about 10 mm). Then, 2) the electric-discharge wire is moved in the −Z direction to a position which is higher than the lower surface by the amount corresponding to the thickness of the base 4" of the heat sink 2". Next, the electric-discharge wire is moved in the +Y direction by the amount corresponding to the width of a slot. Then, 3) the electric-discharge wire is moved in the +Z direction to a position which is lower than an upper surface by the amount corresponding to the thickness of the base 4' of the heat sink 2'. The operations 1) to 3) are repeatedly performed twice and, thereafter, the electric-discharge wire is moved in the +Y direction, thus resulting in the provision of the heat sinks 2' and 2" from the porous member 10'.

With this cutting method, it is possible to form two heat sinks at the same time, thereby further increasing the productivity in comparison with the aforementioned cutting method for forming slots.

Second Embodiment

Figure 5:
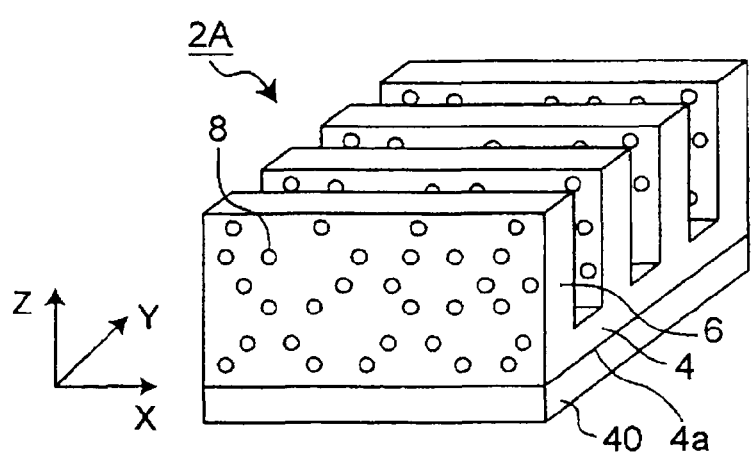
FIG. 5 illustrates a heat sink according to a second embodiment of the present invention.

FIG. 5 illustrates a heat sink according to the present second embodiment, which is generally illustrated by 2A. The heat sink 2A according to the present embodiment includes a plate (second base) 40 having preferable heat transfer characteristics which is bonded to a first surface 4a of a base 4 which is opposite from the side of the base 4 which supports fins 6. A heat producing component is placed on the base 40 (the first surface 4a of the base 4 is thermally connected to the heat producing component).

When a porous member is fabricated as the material of the heat sink 2A, holes 8 may have non-tubular shapes, and the refrigerant paths may be communicated with the first surface 4a of the base 4 through the holes 8. In this case, if the heat sink is operated with the heat producing component placed on the first surface 4a of the base 4, this will cause leakage of the refrigerant from the first surface 4a. Therefore, in the present embodiment, the provision of the base 40 can ensure the sealing characteristic of the heat sink 2A. This results in improvement of the yield of the porous member.

Third Embodiment

Figure 6:
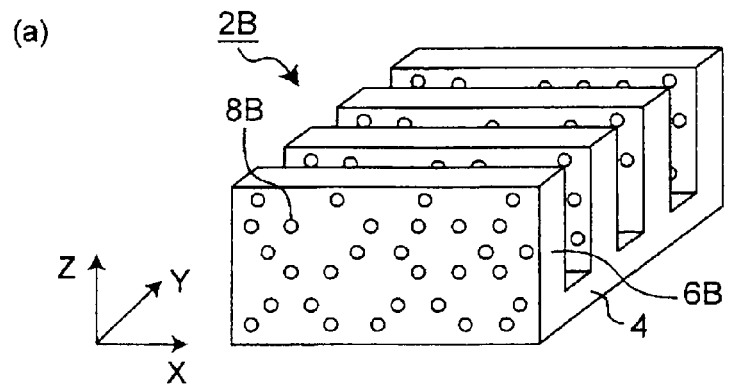
FIG. 6 illustrates a heat sink according to a third embodiment of the present invention.
Figure 6:
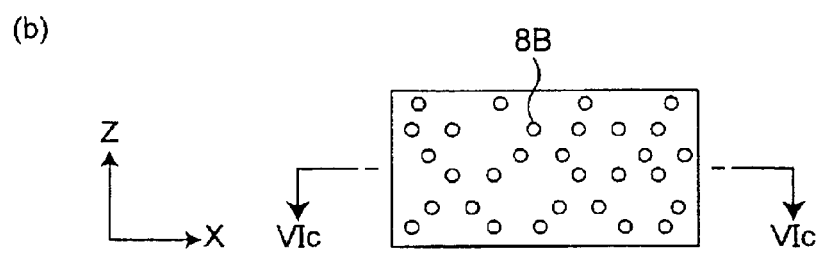
Figure 6:
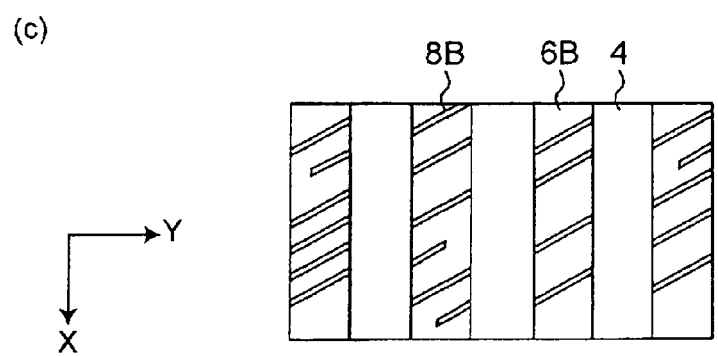

FIG. 6 illustrates a third embodiment of the heat sink according to the present invention. The heat sink 2B according to the present embodiment includes fins 6B having holes 8B penetrating therethrough and extending obliquely, not in parallel to the Y direction (a direction of the arrangement of the fins 6B). However, the fins 6B have a heat transfer area S greater than that of the fins 6 having the same thickness in the first embodiment, thus resulting in an increase of the cooling ability of the heat sink 2B.

The fins 6B of the heat sink 2B can be provided by forming slots along imaginary areas which are not substantially orthogonal to a direction of the extension of the tubular-shaped holes in the porous member (imaginary areas which are parallel to the XZ plane which forms an angle of about 90 degree or less (an acute angle) with the aforementioned direction of the extension).

Further, although there has been described a case where the direction of the extension of tubular-shaped holes is deviated from the Y direction with reference to FIG. 6, the present embodiment also includes cases where the direction of the extension of tubular-shaped holes agrees with the Y direction while a direction of the formation of the slots is deviated from the XY plane.

Fourth Embodiment

FIGS. 7(a) and (b) illustrate a heat sink according to the present fourth embodiment, which is generally illustrated by 2C. In the aforementioned embodiments, the slots are formed in such a way as to leave the portion of the porous member which corresponds to the thickness of the base and, therefore, the fins are coupled to one another through the base. On the contrary, the heat sink 2C according to the present embodiment has through-slots 41 penetrating through a porous member 10 from an upper surface to a lower surface thereof in the Z direction and has a plurality of fins 6C supported by a side wall 42 formed along a single side surface in the X direction. Namely, the fins 6C and the side wall 42 are integrally formed from a porous material. A plate (base) 40 having preferably heat transfer characteristics is bonded to the lower surfaces of the fins 6C in the Z direction. A heat producing component is placed on the base 40. In operation of the heat sink 2C, the base 40 also serves as a seal for preventing the leakage of the refrigerant in cases where the refrigerant paths are communicated with the lower surfaces of the fins 6C through the holes 8. Further, the side wall 42 also serves as a wall forming refrigerant paths, thereby offering an advantage of eliminating the efforts required for fabricating pipes in fabricating the cooling device including the heat sink 2C.

The method for fabricating the heat sink 2C is the same as the method for fabricating the heat sink 2C of FIG. 1. Namely, an electric-discharge wire extending in the Z direction is placed on a rectangular-parallelepiped shaped porous member 10, at the left side of an imaginary area 32C corresponding to a to-be-formed slot, in the X direction. Then, the electric-discharge wire is moved in the +X direction to a position which is spaced leftward apart from the right surface in the X direction by the amount corresponding to a thickness of the side wall 42 of the heat sink 2C. Thereafter, it is moved in the −X direction to form a single through-slot 41. After the formation of a plurality of through-slots, the porous member 10 is bonded to the base 40.

The direction of the arrangement of the fins 6C may either be substantially parallel to the direction of the extension of tubular-shaped through-holes 8 similarly to in the first embodiment or form an acute angle with the aforementioned direction of the extension similarly to in the third embodiment. In the latter case, the heat transfer area S between the through-holes and the refrigerant can be increased, thereby improving the cooling ability of the heat sink 2C.

In the present embodiment, the plurality of fins 6C are coupled to one another through the side wall 42 (in other words, the plurality of fins 6C are supported by the side wall 42 through their side surfaces adjacent to their surfaces bonded to the base 40), which enables bonding the plurality of fins 6C to the base 40 at the same time, thereby improving the productivity.

The scope of the present invention also covers cases where the fins 6C and the side wall 42 are mounted within a pipe which constitutes a cooling path and the wall of the pipe constitutes the base 40 (the heat producing component is placed on the wall of the pipe). This structure also offers the aforementioned effects of the present embodiment.

Figure 8:
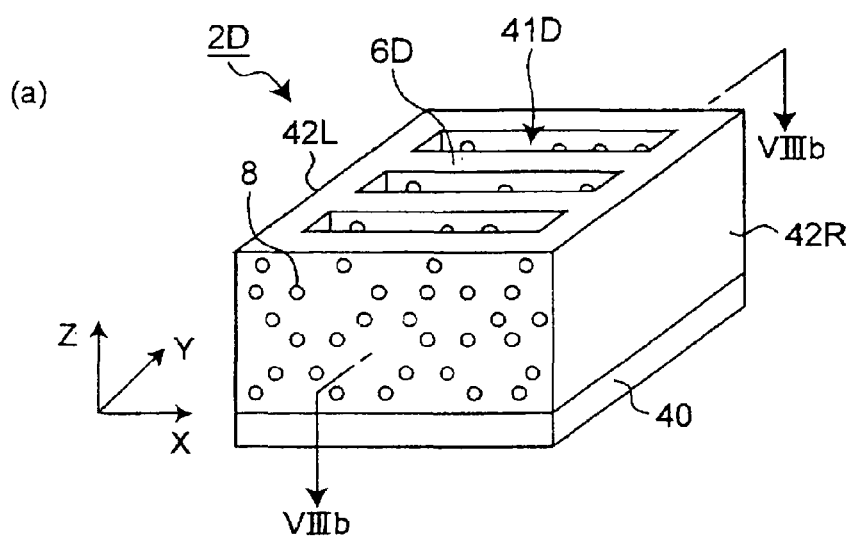
FIG. 8 illustrates another heat sink according to the fourth embodiment of the present invention.
Figure 8:
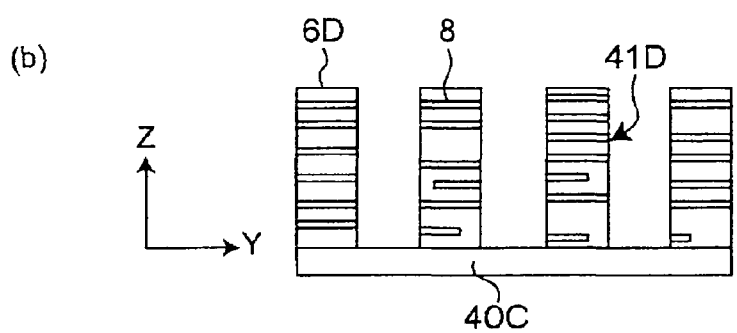

It is not necessary to provide a side wall only at a single side (in the X direction), and side walls 42R and 42L can be provided at the opposite sides, as in a heat sink 2D of FIG. 8. Through-slots 41D which separate adjacent fins 6D are formed by using an end mill, for example. Further, the side walls are only required to couple at least adjacent fins to each other for offering the aforementioned effects of the present embodiment. Accordingly, it is not necessary to provide a side wall along an entire side surface (at a single side in the X direction). For example, as in a heat sink 2E of FIG. 9(a), side walls 42a, 42b and 42c can be alternately provided at the right side and the left side in the X direction (in this case, through-slots 41E for separating adjacent fins 6E are formed in a staggered shape).

Figure 7:
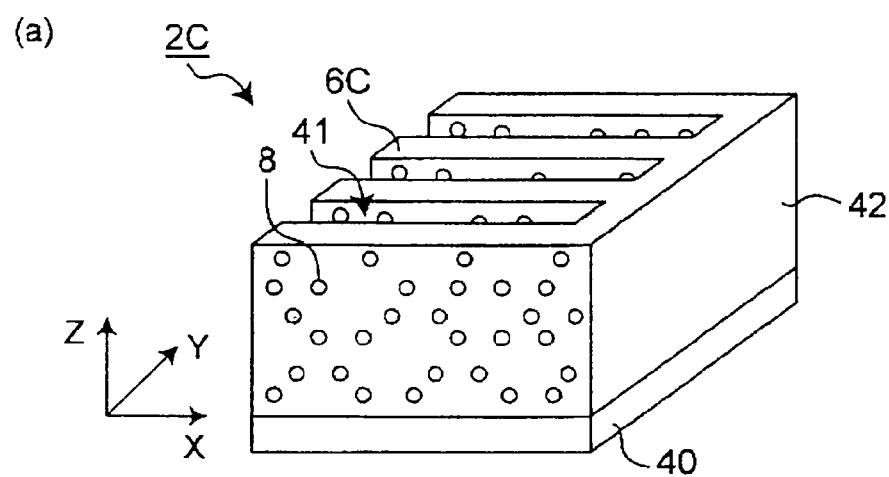
FIG. 7 illustrates a heat sink according to a fourth embodiment of the present invention.
Figure 7:
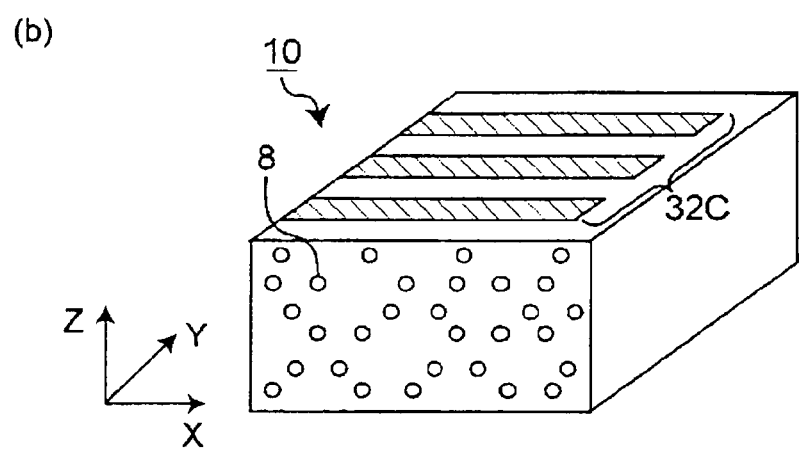

In the case of providing the side wall(s) for supporting all the fins as in FIGS. 7 and 8, it is possible to place another heat producing component on the side wall(s), in addition to the heat producing component placed on the base 40, thereby offering a heat sink capable of addressing the heat generation from the side surface(s). A base can be further bonded to the side wall(s), in order to ensure the sealing characteristic of the heat sink.

Figure 9:
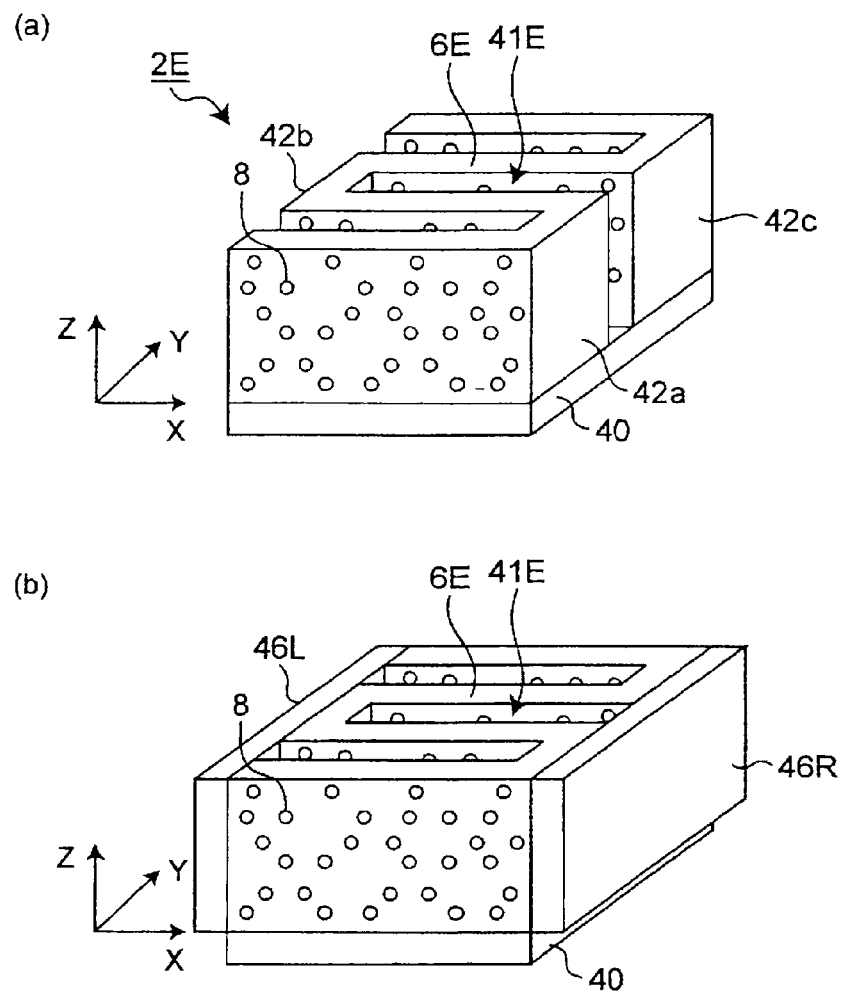
FIG. 9 illustrates another heat sink according to the fourth embodiment of the present invention.

In the case of providing the side walls along portions of the respective side surfaces as in FIG. 9(a), other bases 46R and 46L can be bonded to the respective side walls as illustrated in FIG. 9(b), which enables placing heat producing components on these bases 46R and 46L, thereby offering a heat sink capable of addressing the heat generation from the side surfaces.

Fifth Embodiment

Figure 10:
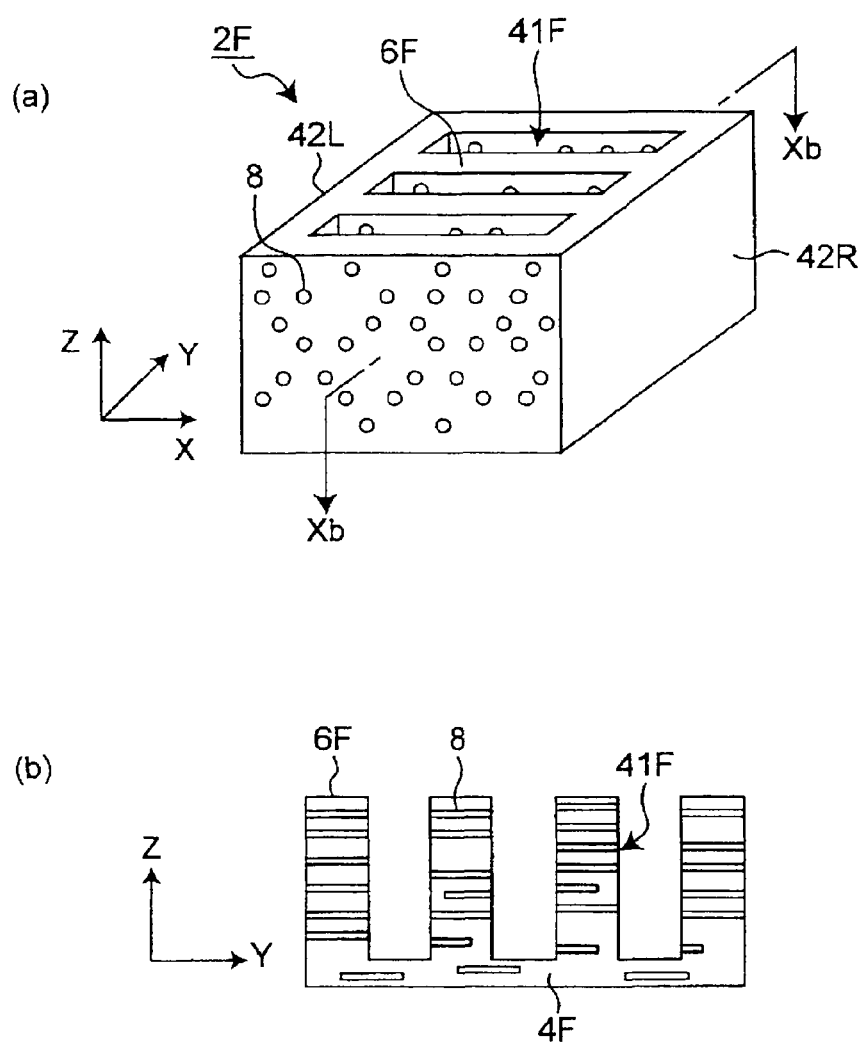
FIG. 10 illustrates a heat sink according to a fifth embodiment of the present invention.

FIG. 10 illustrates a heat sink according to the present fifth embodiment, which is generally illustrated by 2F.

Figure 11:
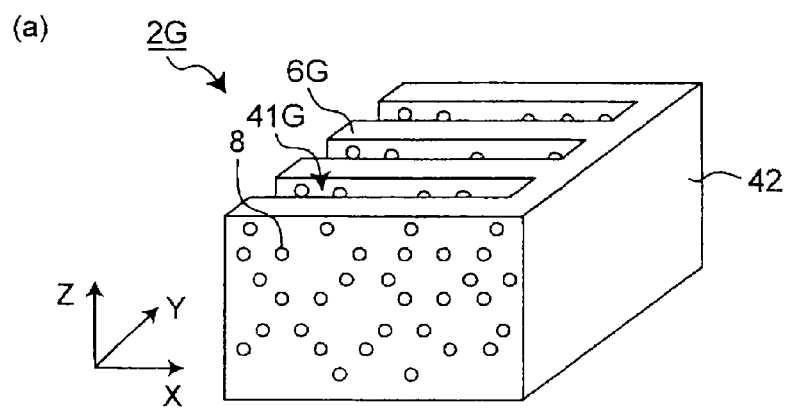
FIG. 11 illustrates another heat sink according to the fifth embodiment of the present invention.
Figure 11:
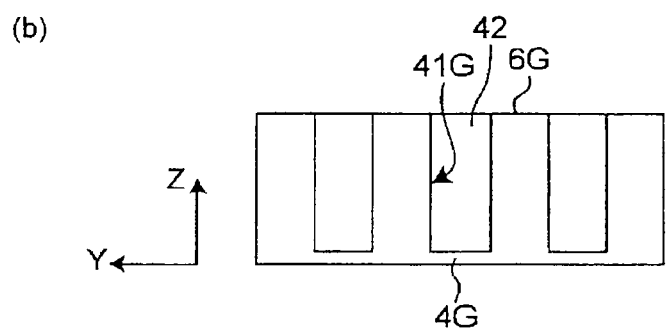

In the first to third embodiments, adjacent fins are coupled to each other through the base. In the fourth embodiment, adjacent fins are coupled to each other through the side wall(s). Also, adjacent fins can be coupled to each other through both a base and side walls. For example, as in the heat sink 2F of FIG. 10, it is possible to provide slots 41F which are outwardly opened only at their one sides (namely, each slot 41F is defined by side walls 42R and 42L, adjacent fins 6F and a base 4F). Also, as in the heat sink 2G of FIG. 11, it is possible to provide slots 41F which are outwardly opened at their adjacent two sides (namely, each slot 41F is defined by a side wall 42, adjacent fins 6G and a base 4G).

Sixth Embodiment

Figure 12:
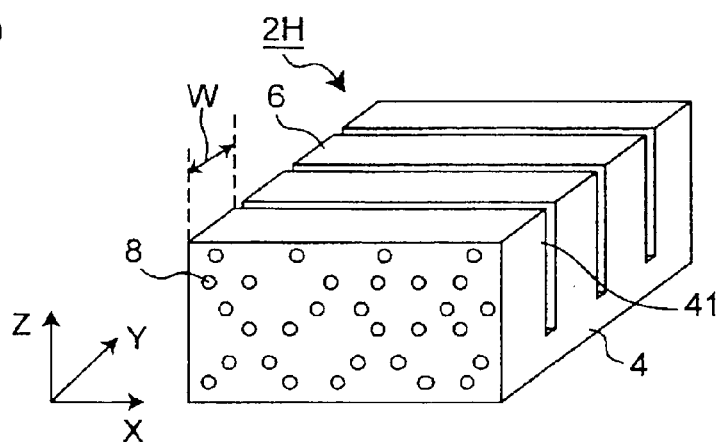
FIG. 12 illustrates a heat sink according to a sixth embodiment of the present invention.
Figure 12:
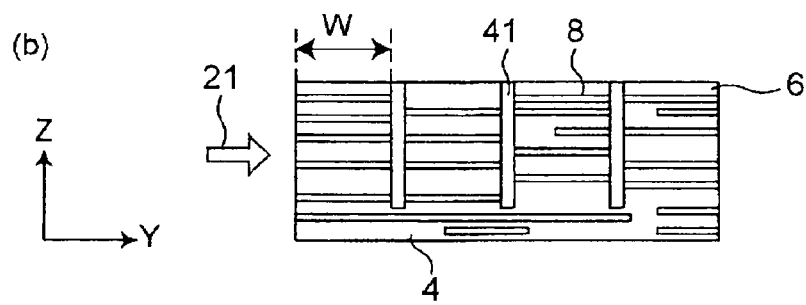
Figure 12:
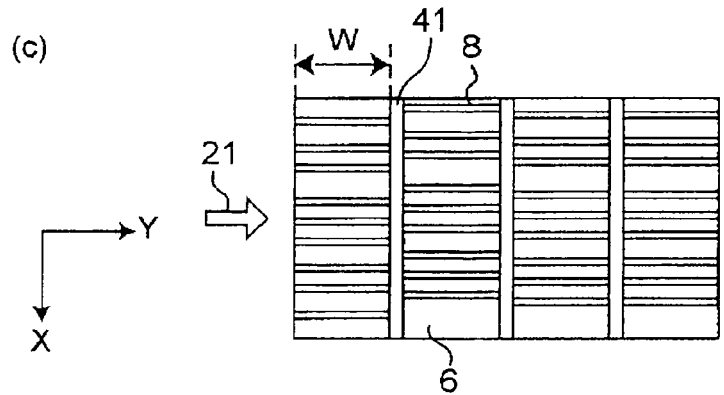

FIG. 12 illustrates a heat sink according to the present sixth embodiment, which is generally illustrated by 2H. (a) is a perspective view, (b) is a cross-sectional view when the heat sink is viewed in the X direction, and (c) is a cross-sectional view when the heat sink is viewed in the Z direction.

The heat sink 2H is formed from a bulk-type lotus-shaped porous member (porous member) having a plurality of tubular-shaped holes 8 having substantially a round-shaped cross-sectional area and extending in the Y direction. The heat sink 2H includes a plurality of slots 41 provided substantially perpendicularly to the Y direction. The width (the length in the Y direction) of the slots 41 is approximately 0.5 mm, which is significantly smaller than that of the heat sink 2 according to the first embodiment.

In the present sixth embodiment, the fabrication of the slots 41 (the cutting processing for forming the slots) is performed through electric-discharge wire machining using an electric-discharge wire, for example. The electric-discharge wire is moved along the XZ plane to form cutouts in the porous member, but the electric-discharge wire is not moved in the direction along the XY plane as in the first embodiment and, therefore, portions of the porous member (imaginary areas 32a to 32c) are not cut away. The width of the slots 41 corresponds to the thickness of the electric-discharge wire and, therefore, is 0.5 mm, for example, as described above. The method for fabricating the slots 41 applies to the following embodiments.

By forming these slots 41, it is possible to increase the ratio of through-holes 8, similarly to in the first embodiment. This results in an increase of the number of holes 8 through which the refrigerant passes, thereby increasing the heat releasing effect. As described above, by setting the width W (the length in the Y direction) of the fins 6 sandwiched by a slot 41 and a slot 41 to 10 mm or less, it is possible to increase the number of through-holes significantly, thereby largely increasing the heat releasing effect (the cooling efficiency).

Further, as a machining method for forming the slots 41, it is possible to employ machining processing using an end mill, instead of electric-discharge wire machining using wire cutting.

Further, the heat sink 2H has no cutout portions (imaginary areas 32a to 32c) in the porous member, which enables flowing the refrigerant through the holes 8 included in the portions corresponding to the cutout portions of the heat sink 2 in the first embodiment, thereby increasing the surface areas which contact with the refrigerant and increasing the cooling ability.

Further, in the present sixth embodiment, it is only necessary to perform machining by moving a cutting tool along a plane (the ZX plane) which is not parallel to the axial direction of the tubular-shaped holes (the Y direction), such as by moving, only in the Z direction, a wire placed to extend in the X direction or by moving, in the direction of the X axis, an end mill placed in the Z direction. In other words, there is no cut surface parallel to the axial direction of the tubular-shaped holes (Y direction), which makes it easier to perform machining than in the first embodiment.

Further, the fins 6 and the base (the supporting base) 4 are integrally structured, which eliminates the necessity of performing processing for bonding the fins 6 to the base through brazing or soldering, thereby increasing the productivity. Further, this structure eliminates the necessity of bonding the fins made of the porous member to the base formed separately from the fins as in the conventional structure (JP 2001-358270, A), thus resulting in reduction of the cost and the time for fabrication.

Seventh Embodiment

Figure 13:
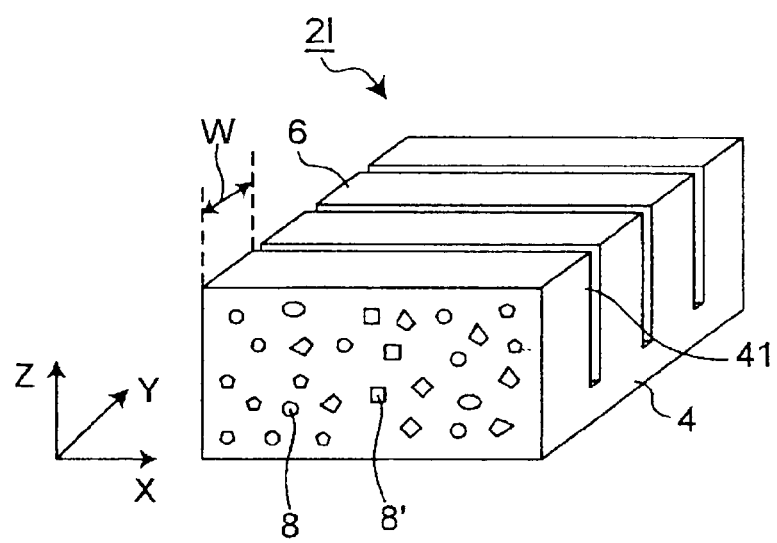
FIG. 13 illustrates a heat sink according to a seventh embodiment of the present invention.

FIG. 13 illustrates a heat sink according to the present seventh embodiment, which is generally illustrated by 2I.

The heat sink 2I is made of a lotus-shaped porous member having holes 8' having non-round shaped cross-sectional areas perpendicular to the axial direction (the Y direction), as well as holes 8 having round-shaped cross-sectional areas.

Since there is no restriction on the cross-sectional areas of holes 8 and 8", it is possible to employ, for the heat sink 2I, a lotus-shaped porous member which has been formed to have holes with non-round shaped cross-sectional areas.

Further, in the following embodiments, similarly, the shape of the cross-sectional area of holes in the lotus-shaped porous member is not limited to a round shape or a non-round shape.

Eighth Embodiment

Figure 14:
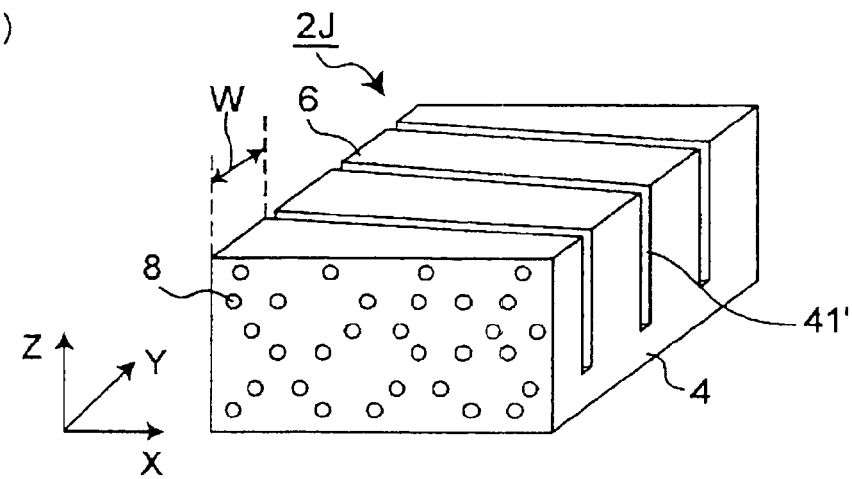
FIG. 14 illustrates a heat sink according to an eighth embodiment of the present invention.
Figure 14:
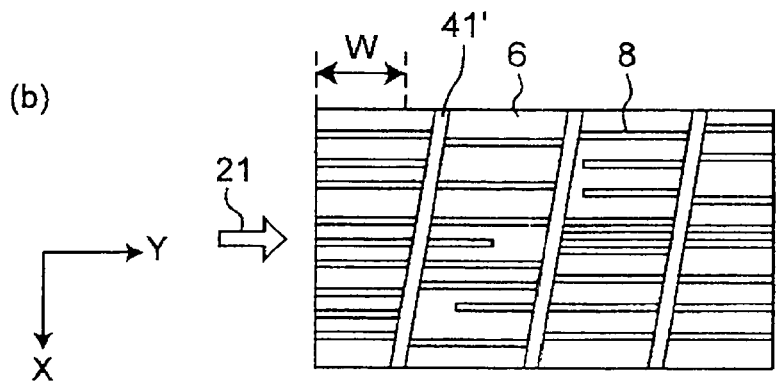
Figure 14:
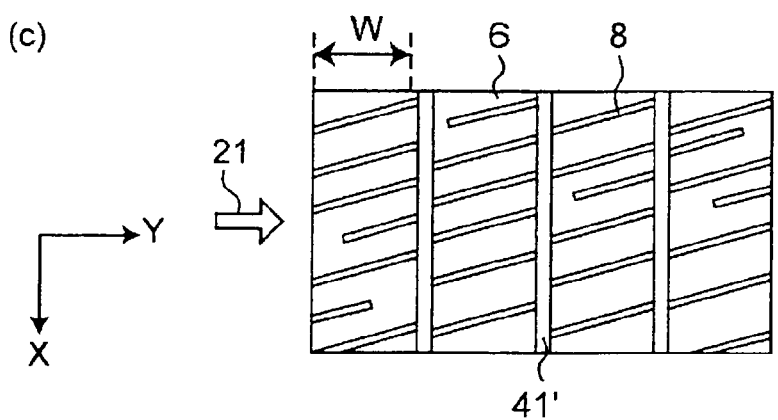

FIG. 14 illustrates a heat sink according to the present eighth embodiment, which is generally illustrated by 2J. (a) illustrates a perspective view, and (b) illustrates a cross-sectional view when the heat sink is viewed in the Z direction.

The heat sink 2J according to the present eighth embodiment has tubular-shaped holes 8 having an axis in the Y direction while having slots 41' formed to be inclined by a predetermined angle with respect to the XZ plane.

In order to flow a large amount of cooling liquid through the holes 8 in the fins 6 made of the lotus-shaped porous member for increasing the heat transfer coefficient, it is preferable to form the slots 41 along the plane perpendicular to the axial direction of the tubular-shaped holes 8 (the Y direction) as in the aforementioned embodiment. However, it is not necessary to form the slots 41 in the direction which is accurately perpendicular to the axial direction of the holes 8.

By permitting the formation of the slots 41' such that they are inclined with respect to the XZ plane as in the present eighth embodiment, it is possible to simplify the machining processing for forming the heat sink 2J, thereby shortening the fabrication time.

Further, in order to increase the ratio of holes 8 penetrating through the fins, the length W of the fins 6 in the Y direction is set to 10 mm or less.

Also, it is possible to employ a lotus-shaped porous member having holes 8 with an axial direction inclined with respect to the Y direction, as illustrated in (c). In the case of (c), the slots 41' are formed along the XZ plane. With this structure, similarly, it is possible to simplify the machining processing for forming the heat sink 2J, thereby shortening the fabrication time.

Ninth Embodiment

Figure 15:
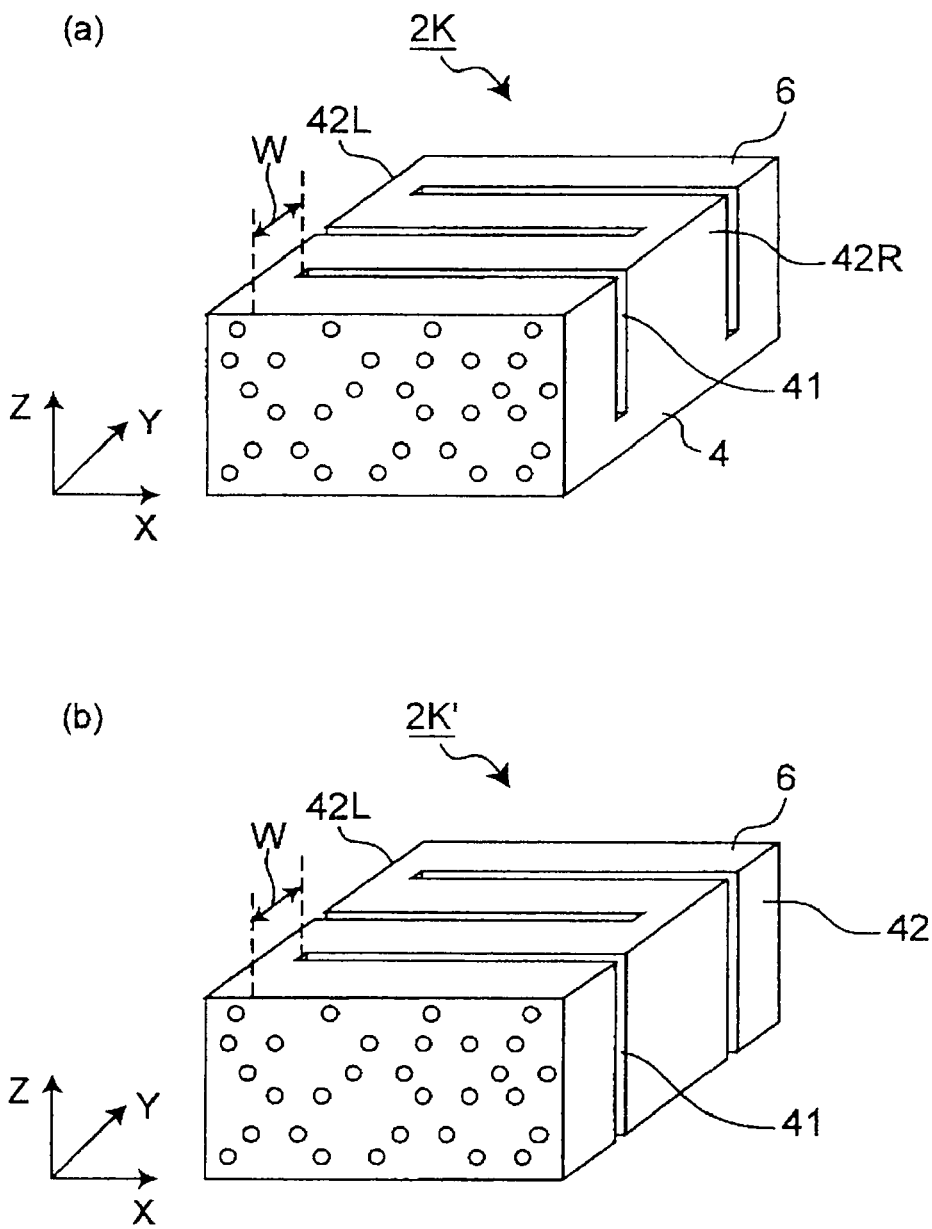
FIG. 15 illustrates a heat sink according to a ninth embodiment of the present invention.

FIG. 15 illustrates a heat sink according to the present ninth embodiment, which is generally illustrated by 2K.

The heat sink 2K illustrated in (a) has slots 41 formed in such a way as to leave side walls 42L and 42R and a base 4. The slots 41 are formed by alternately cutting the opposite sides of a lotus-shaped porous member such that the slots 41 are substantially parallel to the XZ plane. Namely, the slots 41 are formed in the Z direction, such that they are arranged in a staggered shape.

On the other hand, the heat sink 2K' illustrated in (b) has slots 41 formed in such a way as to form cutouts in the base 4 while leaving side walls 42L and 42R.

With these heat sinks 2K and 2K", it is possible to increase the ratio of through-holes 8, thereby increasing the cooling efficiency. Further, the fins 6 and the base 4 having holes 8 through which the refrigerant passes can be integrally formed, which can eliminate processing and costs for bonding the fins 6 to the base 4, thereby increasing the productivity.

Further, the heat sink 2K or 2K" can be bonded to a base plate having preferable heat transfer characteristics, which enables bonding the plurality of fins 6 to the base plate at the same time, thereby enabling simplification of the fabrication processes and reduction of the fabrication cost.

Further, the slots 41 are formed by electric-discharge wire machining through wire cutting or machining processing using an end mill.

Tenth Embodiment

Figure 16:
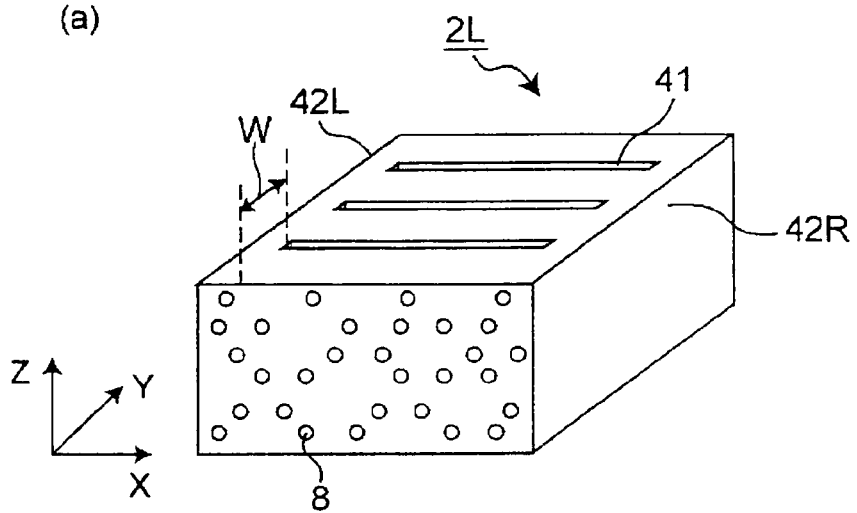
FIG. 16 illustrates a heat sink according to a tenth embodiment of the present invention.
Figure 16:
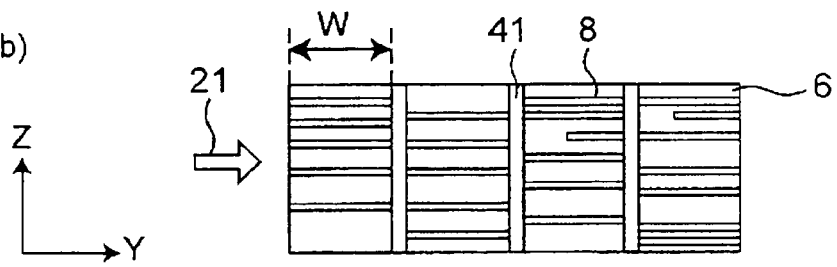
Figure 16:
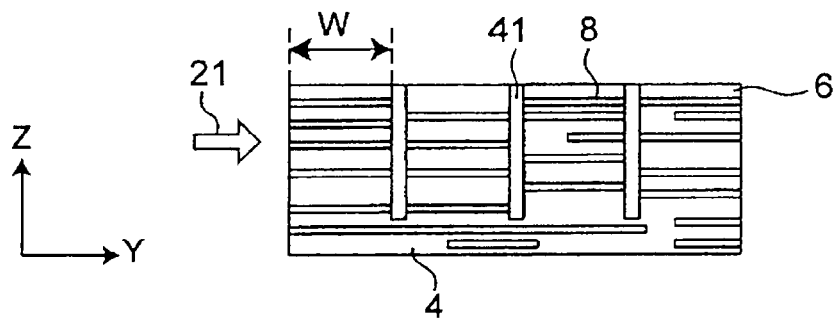

FIG. 16 illustrates a heat sink according to the present tenth embodiment, which is generally illustrated by 2L. (a) is a perspective view, and (b) and (c) are cross-sectional views when the heat sink is viewed in the X direction.

The heat sink 2L has slots 41 formed in such a way as to leave side walls 42L and 42R. The structure of (b) has slots 41 penetrated therethrough in the Z direction from an upper surface to a lower surface, while the structure of (c) has slots 41 formed in such a way as to leave a base 4 along the bottom surface.

For forming these slots 41, machining processing is performed using an end mill. Namely, an end mill placed in the Z direction is moved in the X direction to form the slots 41.

Generally, a heat sink is mounted within a duct for flowing refrigerant therethrough. In the heat sink 2L having the side walls integrally formed therewith as illustrated in the present tenth embodiment, the side walls 42L and 42R also serve as duct walls, which can eliminate the costs and processing required for fabricating duct walls.

Further, the heat sink 2L can be bonded to a base plate having preferable heat transfer characteristics, which enables bonding the plurality of fins 6 to the base plate at the same time, thereby enabling simplification of the fabrication processes and reduction of the fabrication cost.

Particularly, in the heat sink 2L having the base 4 and the side walls 42L and 42R which are integrally formed therewith as illustrated in (c), the base 4, as well as the side walls 42L and 42R, forms a duct wall, thereby further eliminating the costs and processing required for fabricating duct walls.

Eleventh Embodiment

Figure 17:
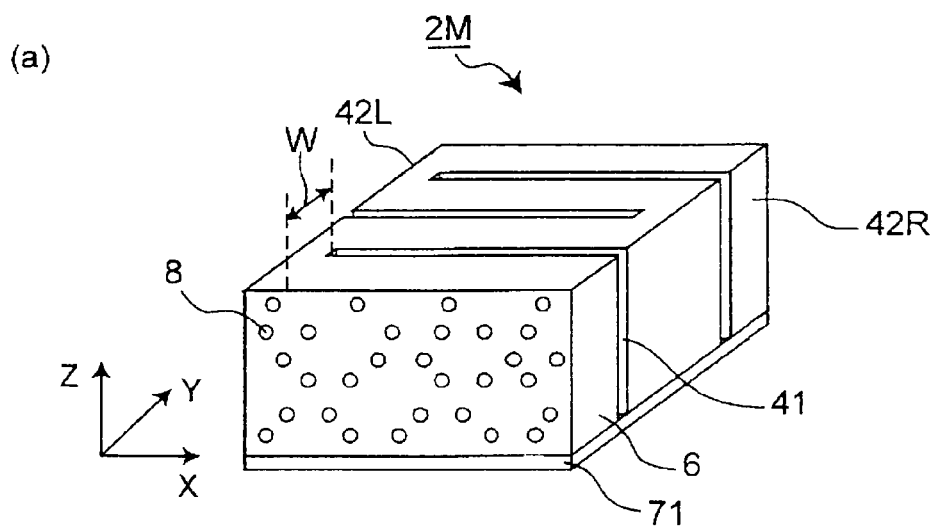
FIG. 17 illustrates a heat sink according to an eleventh embodiment of the present invention.
Figure 17:
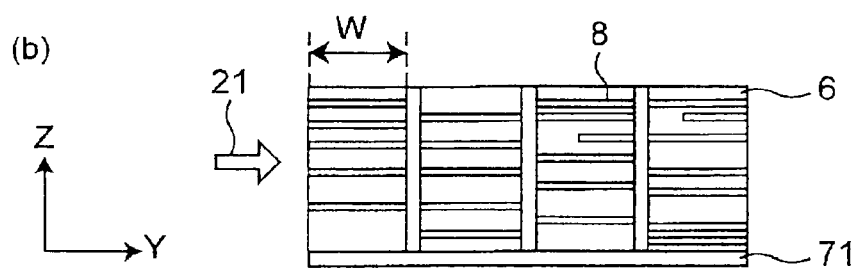

FIG. 17 illustrates a heat sink according to the present eleventh embodiment, which is generally illustrated by 2M. (a) is a perspective view, and (b) is a cross-sectional view when the heat sink is viewed in the X direction.

The heat sink 2M is structured by bonding the heat sink 2K' according to the ninth embodiment, which is illustrated in FIG. 15(b), to a supporting table 71 having preferable heat transfer characteristics. The supporting table 71 is made of, for example, cupper and is bonded to the heat sink 2K' through soldering or brazing.

In the present eleventh embodiment, the heat sink 2K' is bonded to the supporting table 71, which enables bonding the plurality of fins 6 to the supporting table 71 at the same time, thereby enabling simplification of the fabrication processes and reduction of the fabrication cost.

Figure 18:
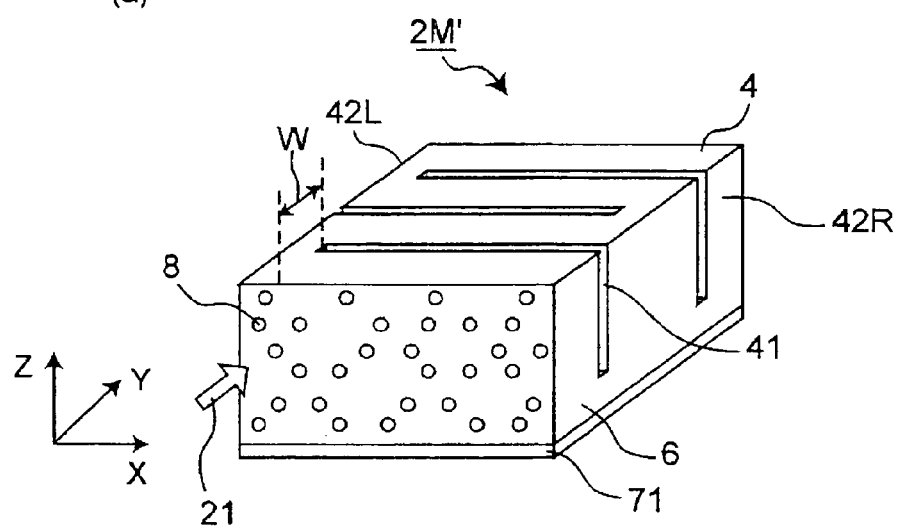
FIG. 18 illustrates another heat sink according to the eleventh embodiment of the present invention.
Figure 18:
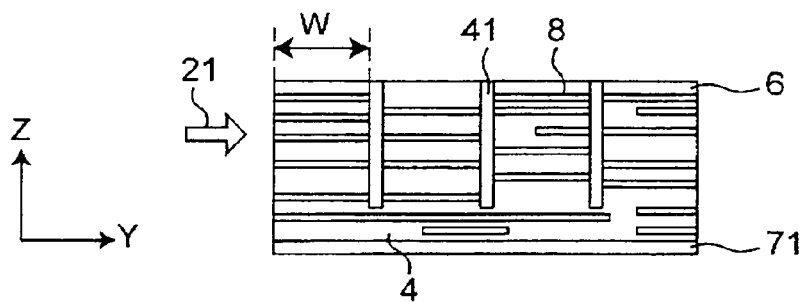

On the other hand, FIG. 18 illustrates another heat sink according to the present eleventh embodiment, which is generally illustrated by 2M'. (a) is a perspective view, and (b) is a cross-sectional view when the heat sink is viewed in the X direction.

The heat sink 2M' is structured by bonding the heat sink 2K' according to the ninth embodiment, which is illustrated in FIG. 15(*a*), to a supporting table 71 having preferable heat transfer characteristics.

With this structure, it is possible to bond the plurality of fins 6 to the supporting table 71 at the same time, thereby enabling simplification of the fabrication processes and reduction of the fabrication cost.

Twelfth Embodiment

Figure 19:
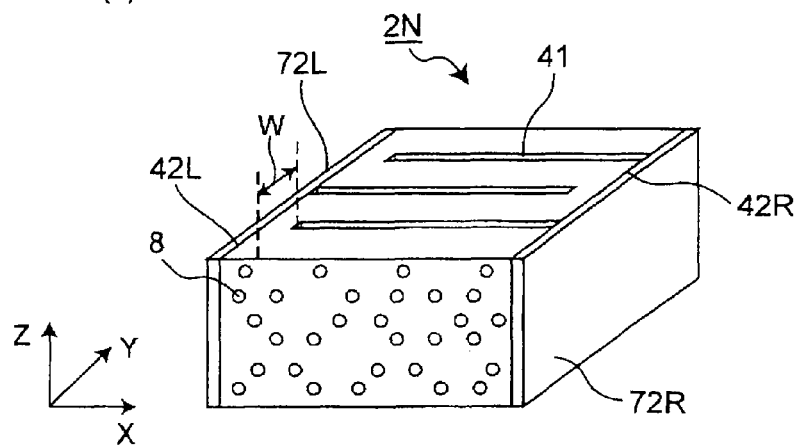
FIG. 19 illustrates a heat sink according to a twelfth embodiment of the present invention.
Figure 19:
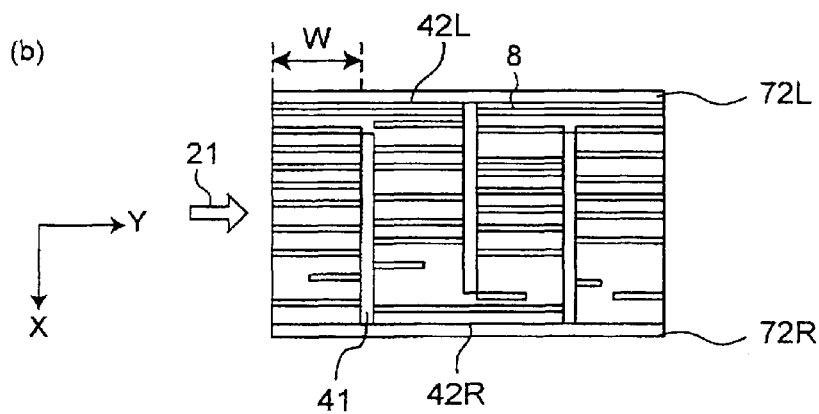

FIG. 19 illustrates a heat sink according to the present twelfth embodiment, which is generally illustrated by 2N. (a) is a perspective view, and (b) is a cross-sectional view when the heat sink is viewed in the Z direction.

The heat sink 2N is structured by bonding side wall plates 72L and 72R having preferable heat transfer characteristics to the side walls 42L and 42R of the heat sink 2K according to the ninth embodiment illustrated in FIG. 15(*a*). The side wall plates 72L and 72R are made of copper as an example, and are bonded to the side walls 42L and 42R of the heat sink 2K, respectively, through soldering or brazing.

The bottom surface and the opposite side surfaces of the heat sink 2N are flat, which enables placing heat producing components on the side wall plates, as well as on the bottom surface, for cooling them.

In the present twelfth embodiment, the heat sink 2K is bonded to the side wall plates 72L and 72R, which enables bonding the plurality of fins 6 to the side wall plates 72L and 72R at the same time, thereby enabling simplification of the fabrication processes and reduction of the fabrication cost.

Thirteenth Embodiment

Figure 20:
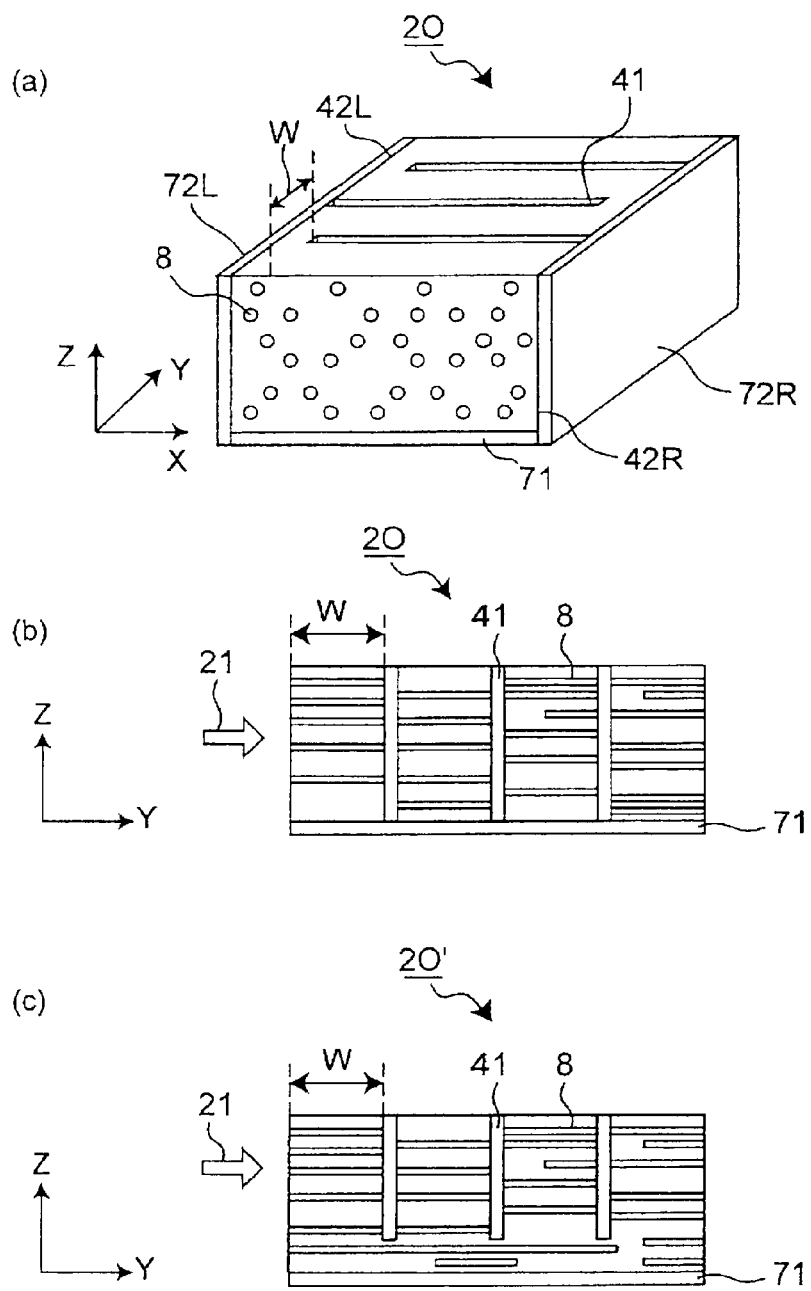
FIG. 20 illustrates a heat sink according to a thirteenth embodiment of the present invention.

FIG. 20 illustrates heat sinks according to the present thirteenth embodiment, which are generally illustrated by 2O and 2O'. (a) is a perspective view, and (b) and (c) are cross-sectional views when the heat sinks are viewed in the X direction.

The heat sink 2O illustrated in (b) is structured by bonding the heat sink 2K' according to the ninth embodiment, which is illustrated in FIG. 15(*b*), to a supporting table 71 having preferable heat transfer characteristics and to side wall plates 72L and 72R.

The heat sink 2O' illustrated in (c) is structured by bonding the heat sink 2K according to the ninth embodiment, which is illustrated in FIG. 15(*a*), to a supporting table 71 having preferable heat transfer characteristics and to side wall plates 72L and 72R.

The bottom surfaces and the opposite side surfaces of the heat sinks 2O and 2O' are flat, which enables placing heat producing components on their side wall plates 72L and 72R as well as on their bottom surfaces for cooling them.

In the present thirteenth embodiment, the heat sinks 2K and 2K' are bonded to the supporting plate 71 and the side wall plates 72L and 72R, which enables bonding the plurality of fins 6 to the supporting table 71 and the side wall plates 72L and 72R at the same time, thereby enabling simplification of the fabrication processes and reduction of the fabrication cost.

Fourteenth Embodiment

Figure 21:
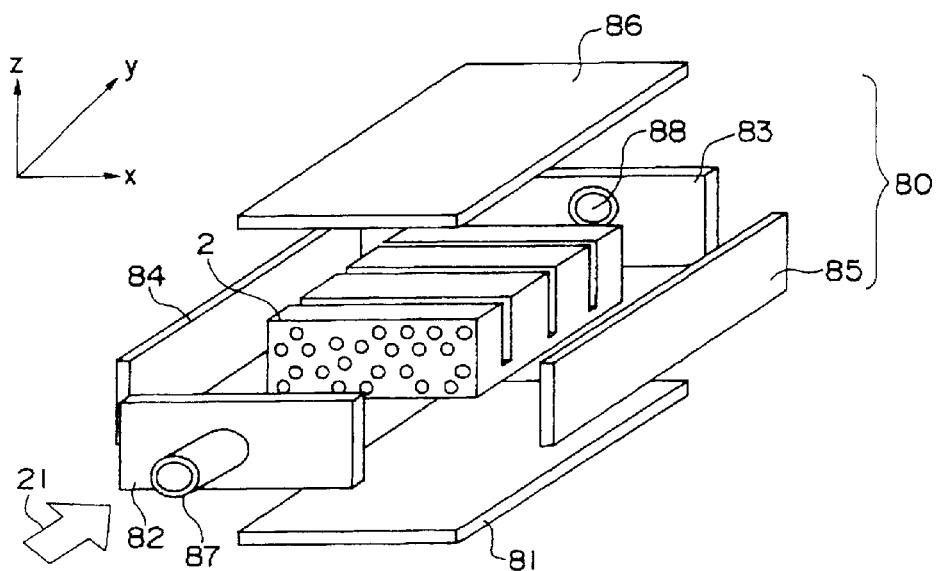
FIG. 21 illustrates a duct and a heat sink according to a fourteenth embodiment of the present invention.

FIG. 21 illustrates a state where the heat sink 2 is incorporated in a duct 80. The duct 80 is constituted by a bottom plate 81, side plates 82, 83, 84 and 85 and an upper plate 86. The side plates 82 and 83 are provided with pipes 87 and 88 such that a cooling medium flows in a direction of an arrow 21.

The duct 80 is sized to accommodate the heat sink 2 therein exactly. Further, the side plates 82 and 83 including the pipes 87 and 88 are placed such that they sandwich the heat sink 2 therebetween at the opposite surfaces of the heat sink 2 which have holes 8.

Further, the heat sink 2 can be bonded to the bottom surface 81 of the duct 80 through soldering or the like.

Also, as the heat sink housed within the duct 80, the heat sink 2A and the like according to other embodiments can be employed, instead of the heat sink 2 according to the first embodiment.

Fifteenth Embodiment

Figure 22:
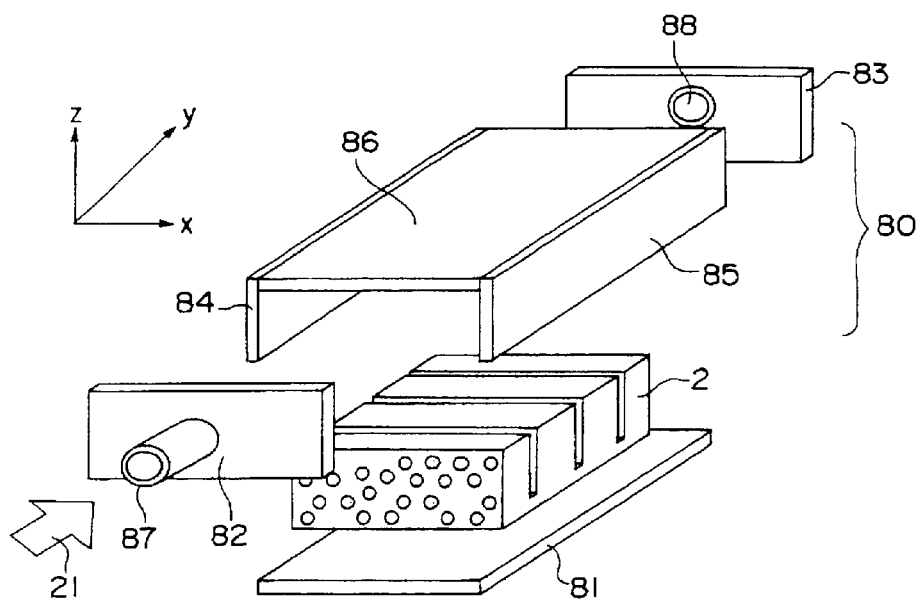
FIG. 22 illustrates a duct and a heat sink according to a fifteenth embodiment of the present invention.

FIG. 22 illustrates a state where the heat sink 2 is incorporated in a duct 80. The duct 80 is constituted by a bottom plate 81, side plates 82, 83, 84 and 85 and an upper plate 86. The side plates 84 and 85 and the upper plate 86 are preliminarily bonded to one another. The other structures are the same as those of the aforementioned fifteenth embodiment.

By preliminarily bonding the side plates 84 and 85 and the upper plate 86 to one another as described above, it is possible to simplify the processing for assembling the duct 80.

The invention claimed is:

1. A heat sink comprising:
   a base having a first surface which is thermally connected to a heat producing component; and
   a plurality of fins supported by a second surface of the base which is opposite from said first surface and arranged in a direction parallel to one of the sides of the heat sink, each fin having a plurality of tubular-shaped through-holes extending in a predetermined direction;
   wherein the base and the plurality of fins are integrally formed from a porous metal or silicon material by cutting one or more slots to form the fins, and
   wherein said one or more slots are formed such that the predetermined direction of extension of the tubular-shaped holes is oblique to a direction of the arrangement of the fins.

2. The heat sink according to claim 1, further comprising a second base bonded to the first surface of the base.

3. The heat sink according to claim 1, wherein a porous member having a predetermined shape is prepared, and a cutting processing is applied to the porous member for forming the one or more slots to form a base or a side wall and the plurality of fins.

4. The heat sink according to claim 3, wherein the slots intersect with the tubular-shaped holes.

5. The heat sink according to claim 3, wherein
   the spacing of the slots each being provided between adjacent fins is equal to or more than 1 mm.

6. The heat sink according to claim 3, wherein the spacing of the slots each being provided between adjacent fins is equal to or less than 0.5 mm.

7. The heat sink according to claim 1, wherein said porous member is prepared by preparing a metal and a gas which offer a metal-gas phase diagram having an eutectic point in an isobaric gas atmosphere, melting the metal in the isobaric gas atmosphere, then solidifying the molten metal in a predetermined direction within a mold having a temperature gradient therein and, thereafter, processing the solidified metal into a predetermined shape.

8. The heat sink according to claim 1, wherein said heat sink has a width of about 10 mm or less.

* * * * *